(12) United States Patent
Yang et al.

(10) Patent No.: US 7,863,100 B2
(45) Date of Patent: Jan. 4, 2011

(54) INTEGRATED CIRCUIT PACKAGING SYSTEM WITH LAYERED PACKAGING AND METHOD OF MANUFACTURE THEREOF

(75) Inventors: JoungIn Yang, Koyang-si (KR); Dongjin Jung, Icheon-si (KR); DongSam Park, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/408,662

(22) Filed: Mar. 20, 2009

(65) Prior Publication Data
US 2010/0237482 A1  Sep. 23, 2010

(51) Int. Cl.
*H01L 21/00* (2006.01)
*H01L 23/02* (2006.01)
*H01R 12/16* (2006.01)

(52) U.S. Cl. .................. 438/109; 438/127; 257/686; 257/724; 257/780; 257/787; 257/E21.614; 361/790; 361/792

(58) Field of Classification Search .................. None
See application file for complete search history.

(56) References Cited

U.S. PATENT DOCUMENTS

| | | | |
|---|---|---|---|
| 5,977,640 A | 11/1999 | Bertin et al. | |
| 6,204,562 B1 | 3/2001 | Ho et al. | |
| 6,348,728 B1 | 2/2002 | Aiba et al. | |
| 6,429,528 B1 | 8/2002 | King et al. | |
| 6,451,624 B1 | 9/2002 | Farnworth et al. | |
| 6,489,676 B2 | 12/2002 | Taniguchi et al. | |
| 6,740,964 B2 | 5/2004 | Sasaki | |
| 6,768,186 B2 | 7/2004 | Letterman, Jr. et al. | |
| 7,466,024 B2 | 12/2008 | Ito et al. | |
| 2005/0012195 A1* | 1/2005 | Go et al. ..................... | 257/686 |
| 2007/0216006 A1 | 9/2007 | Park et al. | |
| 2008/0023814 A1* | 1/2008 | Yang .......................... | 257/686 |
| 2008/0150115 A1* | 6/2008 | Watanabe et al. ........... | 257/686 |
| 2009/0236718 A1* | 9/2009 | Yang et al. ................. | 257/686 |
| 2009/0243073 A1* | 10/2009 | Carson et al. .............. | 257/686 |
| 2010/0032821 A1* | 2/2010 | Pagaila et al. .............. | 257/686 |

* cited by examiner

*Primary Examiner*—Alonzo Chambliss
(74) *Attorney, Agent, or Firm*—Mikio Ishimaru

(57) ABSTRACT

A method of manufacture of an integrated circuit packaging system includes: forming a base package having a base interposer; forming an intermediate package having an intermediate interposer and an intermediate package embedded link trace, the intermediate package embedded link trace being encapsulated in an intermediate package mold compound; forming a cap package having a cap interposer; and connecting the intermediate package to the cap package and the base package using the intermediate package embedded link trace.

20 Claims, 8 Drawing Sheets

INTEGRATED CIRCUIT PACKAGING SYSTEM WITH LAYERED PACKAGING AND METHOD OF MANUFACTURE THEREOF

TECHNICAL FIELD

The present invention relates generally to an integrated circuit packaging system, and more particularly to a system for a semiconductor package for a small, dense, and cost-effective solution.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which the integrated semiconductor chips are mounted include a substrate or other chip-mounting device. Substrates are parts that provide a package with mechanical base support and a form of electrical interface that would allow the external world to access the devices housed within the package.

When multiple chips are mounted within the same semiconductor package, routing problems may arise due to the different routing design of each individual chip. To solve this problem, an interposer is often used. An interposer is an electrical interface routing between one socket or connection to another. It is an intermediate layer often used for interconnection routing or as a ground/power plane. Sometimes the terms "substrate" and "interposer" are used to refer to the same thing.

A 3-dimentional (3D) integrated circuit package is a single integrated circuit package built by stacking silicon wafers and/or dies and interconnecting them so that they behave as a single device. A 3D package contains two or more chips stacked together so that the 3D package occupies less space. Each chip in a 3D package could be a conventional chip, a flip chip, or other chip so that the 3D package could have versatile functionalities.

A Package-on-Package (PoP) package is a 3D package in which fully tested packages, typically referred to as Known Good Packages (KGPs), are stacked on top of one another during the board mounting process. A conventional PoP package usually consists of a bottom package and a top package and has a two-tiered configuration. The bottom package is typically an ASIC or baseband chip and the top package may be other functional chip such as memory. Typically both the bottom package and the top package have a laminated substrate or interposer.

The modern trend of semiconductor manufacturing and packaging technology requires multiple chips with different functionalities such as radio-frequency (RF), logic, analog, base-band, and memory be packaged into a single integrated circuit system. Conventional PoP package is facing increasing challenge to accommodate more and more functional chips in a single package with tight space constraint. The conventional two-tiered configuration can no longer fulfill this purpose effectively.

Certain three-tiered Fan-in PoP package is experimented to address this problem. But it suffers from high substrate cost and high manufacturing complexity. Furthermore, some of the conventional PoP packaging techniques require forming via holes through the entire package to connect the top package to the bottom package, resulting in increased manufacturing complexity and cost.

Thus, a need still remains for accommodating the modern trend of semiconductor manufacturing and packaging, reducing the package footprint, increasing functionality integration, and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a base package having a base interposer; forming an intermediate package having an intermediate interposer and an intermediate package embedded link trace, the intermediate package embedded link trace being encapsulated in an intermediate package mold compound; forming a cap package having a cap interposer; and connecting the intermediate package to the cap package and the base package using the intermediate package embedded link trace.

The present invention provides an integrated circuit packaging system including: a base package having a base interposer; a cap package having a cap interposer; and an intermediate package having an intermediate interposer and an intermediate package embedded link trace, the intermediate package embedded link trace being encapsulated in an intermediate package mold compound, the intermediate package being connected to the cap package and the base package through the intermediate package embedded link trace.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
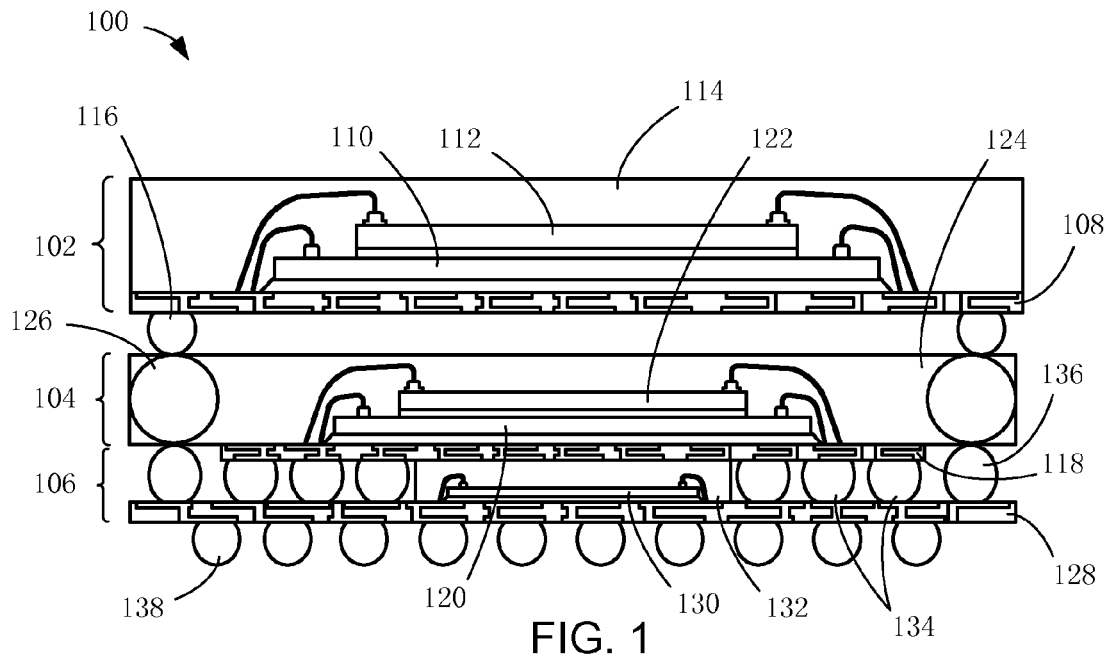
FIG. 1 is a cross-sectional view of a semiconductor package system of an embodiment of the present invention after a stage of singulation.

The following embodiments are described in sufficient details to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings generally show similar orientations for ease of description, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the drawings. The term "on" means that there is direct contact among elements.

The term "processing" as used herein includes deposition of material or photoresist, patterning, exposure, development, etching, cleaning, and/or removal of the material or photoresist as required in forming a described structure.

Figure 10:
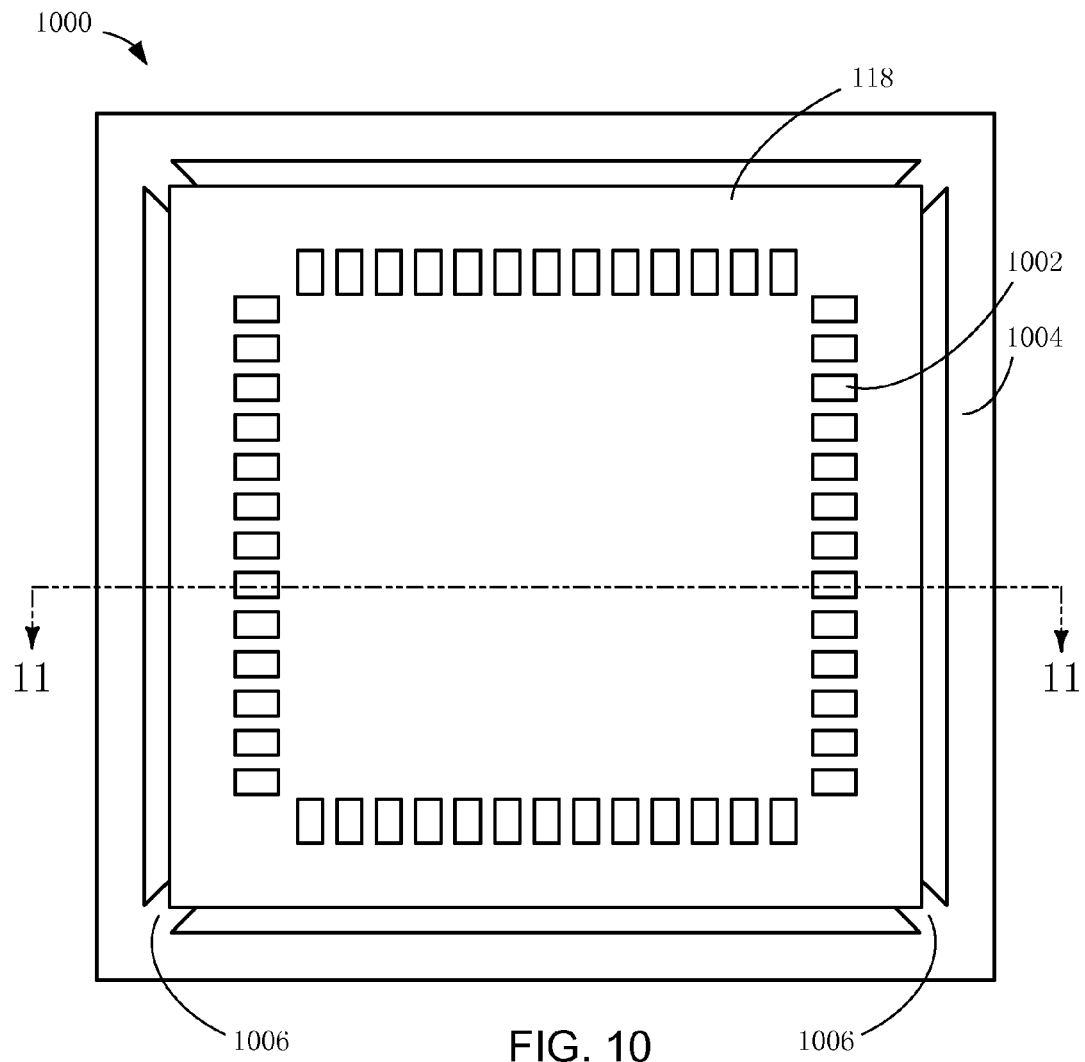
FIG. 10 is a top view of an unfinished first type intermediate package of the first embodiment of the present invention at an initial stage of a process.

Referring now to FIG. 1, therein is shown a cross-sectional view of a semiconductor package system of an embodiment of the present invention along line 11-11 of FIG. 10 after a stage of singulation. The plan view is a square or rectangle and is not shown in the interests of clarity.

A semiconductor package 100 is shown to have a three-tiered structure: a cap package 102, an intermediate package 104, and a base package 106. The cap package 102 has a cap interposer 108. The cap interposer 108 serves as a substrate and could be a laminated substrate.

A cap package first die 110 is attached to the cap interposer 108. A cap package second die 112 is attached to the cap package first die 110. The cap package first die 110 and the cap package second die 112 are encapsulated in a cap package mold compound 114.

A cap package contact extension 116 is attached to the bottom of the cap interposer 108. The cap package contact extension 116 could be a solder ball.

The intermediate package 104 has an intermediate interposer 118. The intermediate interposer 118 serves as a substrate and could be a laminated substrate. An intermediate package first die 120 is attached to the intermediate interposer 118. An intermediate package second die 122 is attached to the intermediate package first die 120. The intermediate package first die 120 and the intermediate package second die 122 are encapsulated in an intermediate package mold compound 124.

An intermediate package embedded link trace 126 is also encapsulated in the intermediate package mold compound 124. The intermediate package embedded link trace 126 could be an embedded solder ball or an embedded solder pillar. It could be made out of fusible material or other conducting materials.

The top and bottom surface of the intermediate package embedded link trace 126 are exposed and not encapsulated. The intermediate package embedded link trace 126 is not in touch with the intermediate interposer 118. The cap package contact extension 116 is in contact with the intermediate package embedded link trace 126.

The base package has a base interposer 128. The base interposer 128 serves as a substrate and could be a laminated substrate. A base package die 130 is attached to the base interposer 128. The base package die 130 is encapsulated in a base package mold compound 132.

An interconnecting contact extension 134 is attached to the top surface of the base interposer 128. The interconnecting contact extension 134 could be a solder ball. The interconnecting contact extension 134 is also attached to the bottom surface of the intermediate interposer 118.

An edge interconnecting contact extension 136 is attached to the top surface of the base interposer 128. The edge interconnecting contact extension 136 could be a solder ball. The edge interconnecting contact extension 136 is also connected to the intermediate package embedded link trace 126.

A base package contact extension 138 is attached to the bottom surface of the base interposer 128. The base package contact extension 138 could be a solder ball.

The three-tiered structure of the semiconductor package 100 increases the packaging density by stacking three packages and multiple chips vertically within a given horizontal area.

The cap package second die 112, the cap package first die 110, the intermediate package second die 122, the intermediate package first die 120, the base package die 130 could incorporate chip design with various functionalities such as RF, base-band, flash memory, logic, and analog, etc. The level of functionality integration is much enhanced by the structure presented here.

The interconnecting contact extension 134 and the edge interconnecting contact extension 136 serve as links connecting the intermediate package 104 to the base package 106. The cap package 102 is connected to the intermediate package 104 through the contact between the cap package contact extension 116 and the intermediate package embedded link trace 126.

The cap package 102 is indirectly connected to the base package 106 through the cap package contact extension 116, the intermediate package embedded link trace 126, and the edge interconnecting contact extension 136.

There is no via holes through any of the three packages presented in the semiconductor package 100. Conventional and prior art semiconductor packages require via holes in the packages to make connections between different layers. The forming of such via holes introduces complexity to the manufacturing process and increases the cost of manufacturing. It has been unexpectedly found that the semiconductor package 100 does not have such problems and hence simplifies the manufacturing process and reduces cost.

It has also been unexpectedly found that the semiconductor package 100 facilitates ready and easy control of the wafer warpage problem suffered by prior art packages and hence enhanced the reliability of the resulting semiconductor packages.

Thus, it has been discovered that the integrated circuit packaging system of the present invention furnishes important and heretofore unknown and unavailable solutions, capabilities, and functional aspects for increasing functionality integration, increasing packing density, reducing processing and manufacturing complexity, reducing cost, and enhancing reliability.

Figure 2:
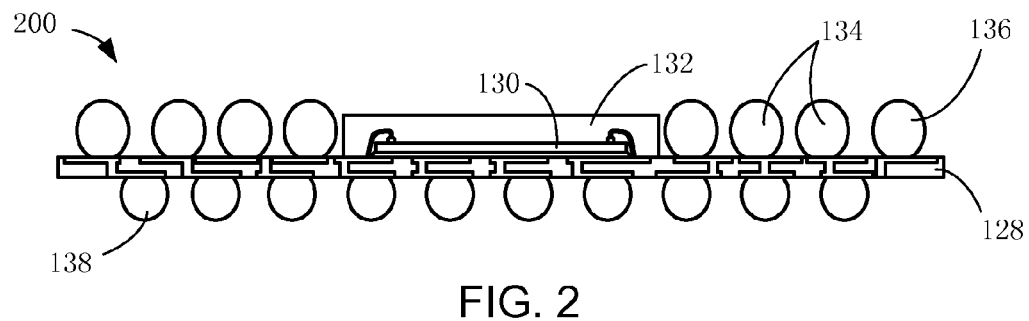
FIG. 2 is a cross-sectional view similar to FIG. 1 of an unfinished semiconductor package of a first embodiment of the present invention after a first type base package is formed.

Referring now to FIG. 2, therein is shown a cross-sectional view similar to FIG. 1 of an unfinished semiconductor package of a first embodiment of the present invention after a first type base package is formed.

In this stage of the processing, a first type base package 200 is formed. The first type base package 200 comprises the base interposer 128, the base package die 130 encapsulated in the base package mold compound 132, the interconnecting contact extension 134 attached to the top surface of the base interposer 128, the edge interconnecting contact extension 136 attached to the top surface of the base interposer 128, and the base package contact extension 138 attached to the bottom surface of the base interposer 128.

The configuration of the first type base package 200 is typically called solder-on-pad (SOP) configuration. In semiconductor manufacturing, the SOP configuration and layout prove to be diverse and versatile. It has been unexpectedly found that using such a SOP configuration in the first type base package 200 in the present invention increases the diversity and versatility of the resulting semiconductor package.

Figure 3:
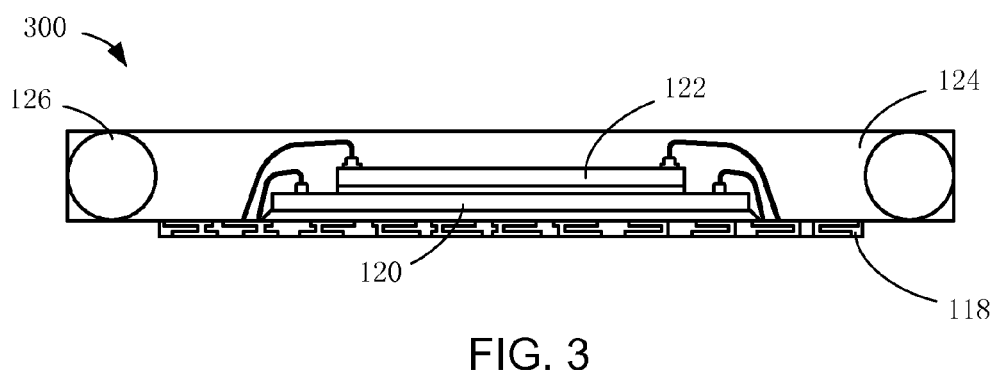
FIG. 3 is a cross-sectional view similar to FIG. 1 of an unfinished semiconductor package of the first embodiment of the present invention after a first type intermediate package is formed.

Referring now to FIG. 3, therein is shown a cross-sectional view similar to FIG. 1 of an unfinished semiconductor package of the first embodiment of the present invention after a first type intermediate package is formed.

In this stage of the processing, a first type intermediate package 300 is formed. The first type intermediate package 300 comprises the intermediate interposer 118, the intermediate package first die 120 and the intermediate package second die 122, the intermediate package embedded link trace 126, and the intermediate package mold compound 124.

The intermediate package first die 120, the intermediate package second die 122, and the intermediate package embedded link trace 126 are encapsulated in the intermediate package mold compound 124. The top and bottom surface of the intermediate package embedded link trace 126 are exposed and not encapsulated.

Figure 4:
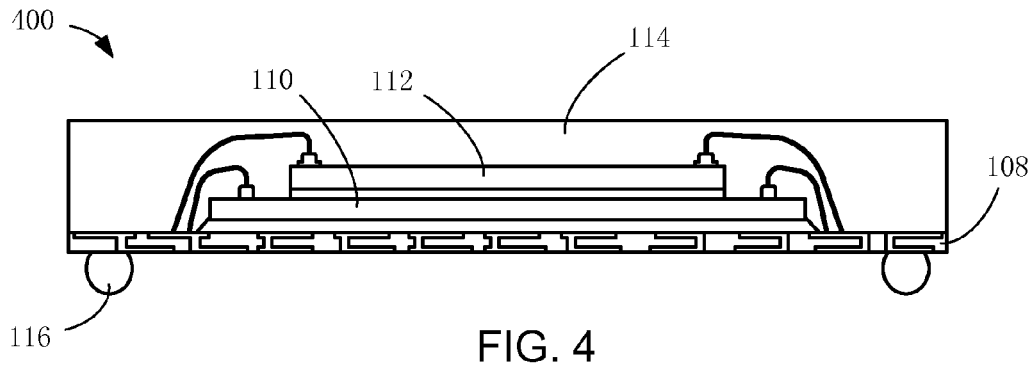
FIG. 4 is a cross-sectional view similar to FIG. 1 of an unfinished semiconductor package of the first embodiment of the present invention after a cap package is formed.

Referring now to FIG. 4, therein is shown a cross-sectional view similar to FIG. 1 of an unfinished semiconductor package of the first embodiment of the present invention after a cap package is formed.

In this stage of the processing, a cap package 400 is formed. The cap package 400 comprises the cap interposer 108, the cap package first die 110, the cap package second die 112, the cap package mold compound 114, and the cap package contact extension 116.

The cap package first die 110 and the cap package second die 112 are encapsulated in the cap package mold compound 114. The cap package contact extension 116 is attached to the bottom surface of the cap interposer 108.

Figure 5:
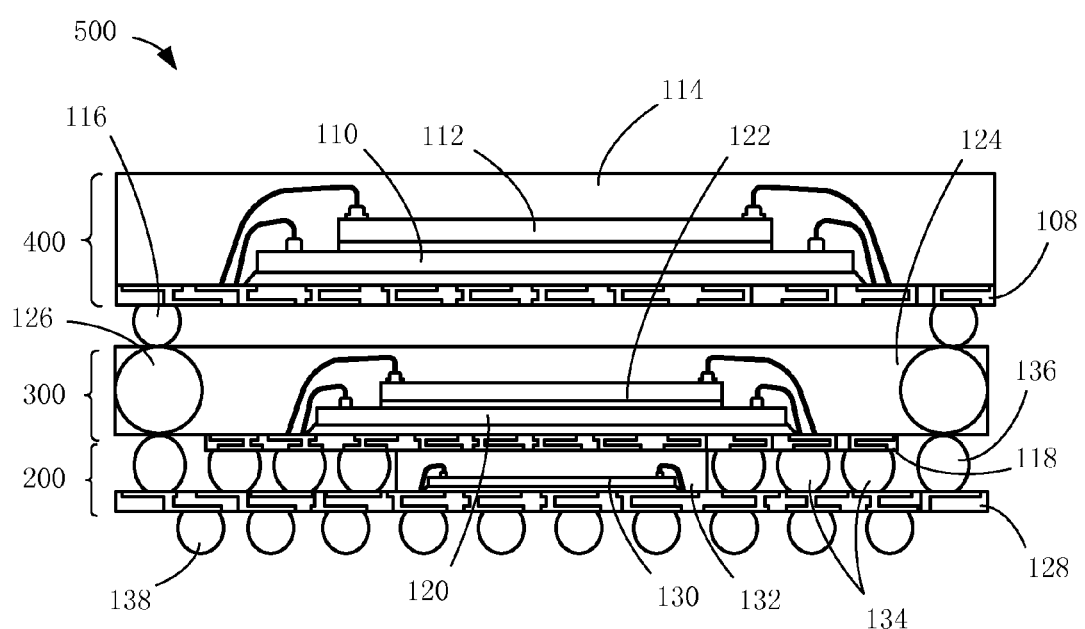
FIG. 5 is a cross-sectional view similar to FIG. 1 of an unfinished semiconductor package of the first embodiment of the present invention after the first type base package, the first type intermediate package, and the cap package are stacked together.

Referring now to FIG. 5, therein is shown a cross-sectional view similar to FIG. 1 of an unfinished semiconductor package of the first embodiment of the present invention after the first type base package, the first type intermediate package, and the cap package are stacked together.

In this stage of the process, the first type base package 200, the first type intermediate package 300, and the cap package 400 are stacked and connected together.

The cap package contact extension 116 of the cap package 400 is connected to the intermediate package embedded link trace 126 of the first type intermediate package 300. The intermediate package embedded link trace 126 of the first type intermediate package 300 is connected to the edge interconnecting contact extension 136 of the first type base package 200. The interconnecting contact extension 134 of the first type base package 200 is connected to the bottom surface of the intermediate interposer 118 of the first type intermediate package 300.

The stacking process results in an unfinished semiconductor package 500. After this stage of the processing, a singulation step is applied and the semiconductor package 100 in FIG. 1 is realized.

Figure 6:
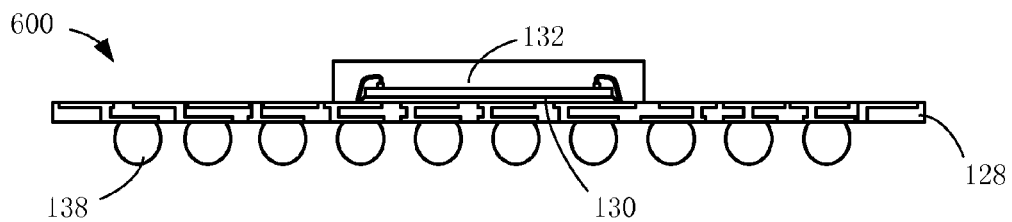
FIG. 6 is a cross-sectional view similar to FIG. 1 of an unfinished semiconductor package of a second embodiment of the present invention after a second type base package is formed.

Referring now to FIG. 6, therein is shown a cross-sectional view similar to FIG. 1 of an unfinished semiconductor package of a second embodiment of the present invention after a second type base package is formed.

In this stage of the processing, a second type base package 600 is formed. The second type base package 600 comprises the base interposer 128, the base package die 130 encapsulated in the base package mold compound 132, and the base package contact extension 138 attached to the bottom surface of the base interposer 128.

Figure 7:
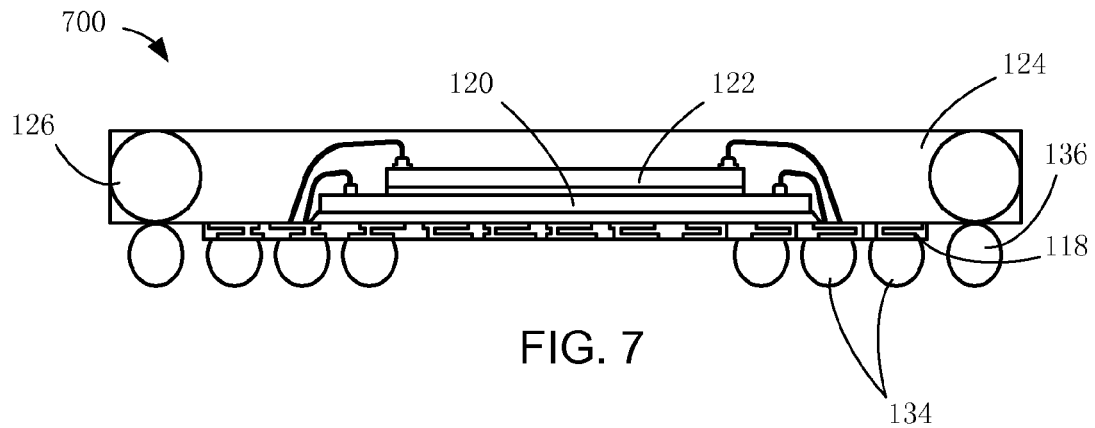
FIG. 7 is a cross-sectional view similar to FIG. 1 of an unfinished semiconductor package of the second embodiment of the present invention after a second type intermediate package is formed.

Referring now to FIG. 7, therein is shown a cross-sectional view similar to FIG. 1 of an unfinished semiconductor package of the second embodiment of the present invention after a second type intermediate package is formed.

In this stage of the processing, a second type intermediate package 700 is formed. The second type intermediate package 700 comprises the intermediate interposer 118, the intermediate package first die 120 and the intermediate package second die 122, the intermediate package embedded link trace 126, the intermediate package mold compound 124, the interconnecting contact extension 134, and the edge interconnecting contact extension 136.

The intermediate package first die 120, the intermediate package second die 122, and the intermediate package embedded link trace 126 are encapsulated in the intermediate package mold compound 124. The top and bottom surface of the intermediate package embedded link trace 126 are exposed and not encapsulated.

The interconnecting contact extension 134 is attached to the bottom surface of the intermediate interposer 118. The edge interconnecting contact extension 136 is attached to the bottom surface of the intermediate package embedded link trace 126.

Compared to the first type intermediate package 300 in FIG. 3, the second type intermediate package 700 comprises additional components: the interconnecting contact extension 134 and the edge interconnecting contact extension 136. Therefore, in practice, the second type intermediate package 700 could be constructed based on an already constructed first type intermediate package 300 in FIG. 3 by adding these additional components.

Figure 8:
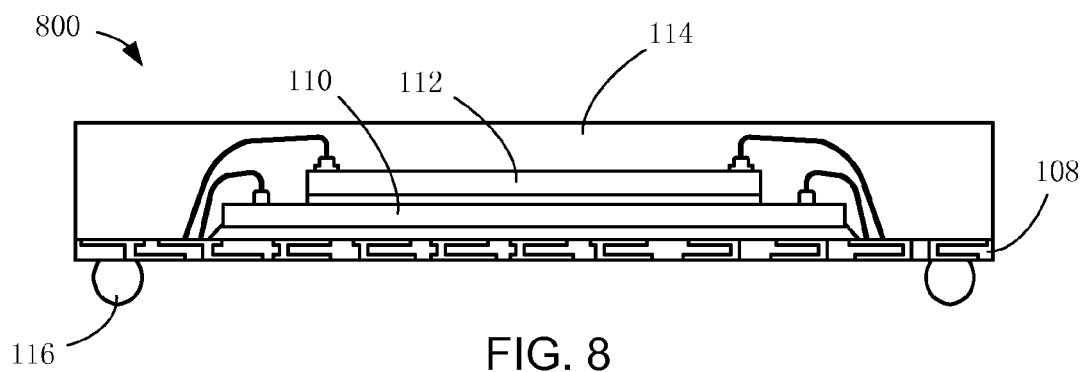
FIG. 8 is a cross-sectional view similar to FIG. 1 of an unfinished semiconductor package of the second embodiment of the present invention after a cap package is formed.

Referring now to FIG. 8, therein is shown a cross-sectional view similar to FIG. 1 of an unfinished semiconductor package of the second embodiment of the present invention after a cap package is formed.

In this stage of the processing, a cap package 800 is formed. The cap package 800 comprises the cap interposer 108, the cap package first die 110, the cap package second die 112, the cap package mold compound 114, and the cap package contact extension 1 16.

The cap package first die 110 and the cap package second die 112 are encapsulated in the cap package mold compound 114. The cap package contact extension 116 is attached to the bottom surface of the cap interposer 108.

The cap package 800 herein is identical to the cap package 400 in FIG. 4.

Figure 9:
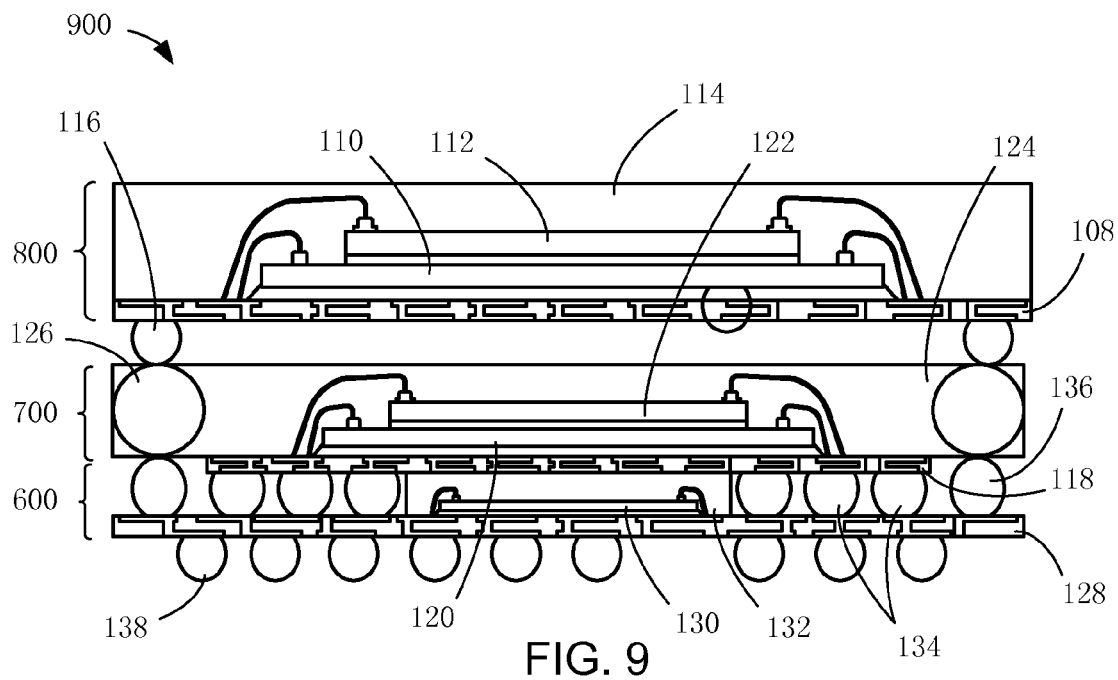
FIG. 9 is a cross-sectional view similar to FIG. 1 of an unfinished semiconductor package of the second embodiment of the present invention after the second type base package, the second type intermediate package, and the cap package are stacked together.

Referring now to FIG. 9, therein is shown a cross-sectional view similar to FIG. 1 of an unfinished semiconductor package of the second embodiment of the present invention after the second type base package, the second type intermediate package, and the cap package are stacked together.

In this stage of the process, the second type base package 600, the second type intermediate package 700, and the cap package 800 are stacked and connected together.

The cap package contact extension 116 of the cap package 400 is connected to the intermediate package embedded link trace 126 of the first type intermediate package 300. The edge interconnecting contact extension 136 of the second type intermediate package 700 is connected to the top surface of the base interposer 128 of the second type base package 600. The interconnecting contact extension 134 of the second type intermediate package 700 is connected to the top surface of the base interposer 128 of the second type base package 600.

The stacking process results in an unfinished semiconductor package 900. After this stage of the processing, a singulation step is applied and the semiconductor package 100 in FIG. 1 is realized.

It is already noted that the second type intermediate package 700 in FIG. 7 could be constructed based on an already constructed first type intermediate package 300 in FIG. 3 by adding the additional components: the interconnecting contact extension 134 and the edge interconnecting contact extension 136. Therefore, forming the first type intermediate package 300 in FIG. 3 is important.

Referring now to FIG. 10, therein is shown a top view of an unfinished first type intermediate package of the first embodiment of the present invention at an initial stage of a process.

An unfinished first type intermediate package 1000 is shown. An intermediate bonding pad 1002 is shown on the intermediate interposer 118. The intermediate interposer 118 is attached to a contact metal trace 1004 through an edge bar 1006 at the corner.

The contact metal trace 1004 is typically made out of copper. The contact metal trace 1004 could also be made out of other metals.

Referring now to FIG. 1, therein is shown a cross-sectional view of an unfinished first type intermediate package of the first embodiment of the present invention along line 11-11 of FIG. 10 after a stage of die-attach and wire bonding of the process.

An unfinished first type intermediate package 1100 is shown. The intermediate package first die 120 is attached to the intermediate interposer 118 and the intermediate package second die 122 is attached to the intermediate package first die 120. The intermediate package first die 120 and the intermediate package second die 122 are connected to the intermediate bonding pad 1002 through an intermediate bonding wire 1102.

Figure 11:
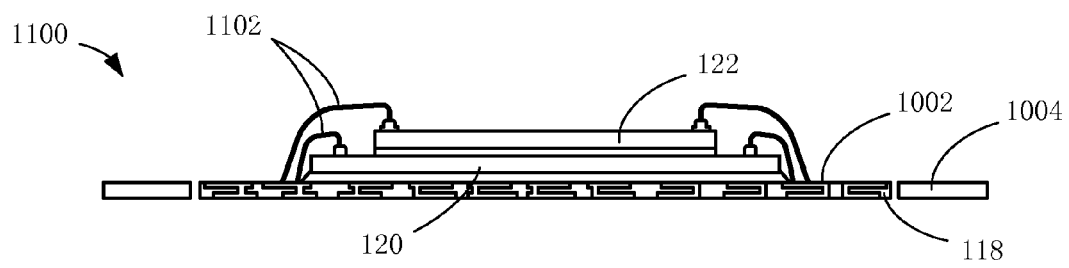
FIG. 11 is a cross-sectional view of an unfinished first type intermediate package of the first embodiment of the present invention along line 11-11 of FIG. 10 after a stage of die-attach and wire bonding of the process.
Figure 12:
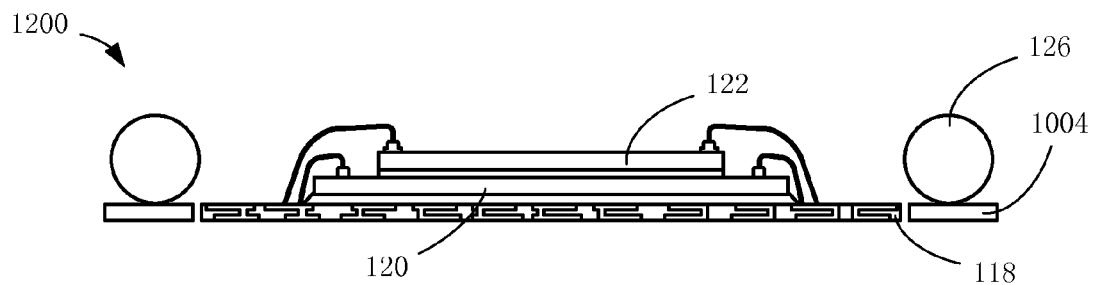
FIG. 12 is a cross-sectional view similar to FIG. 11 of an unfinished first type intermediate package of the first embodiment of the present invention after a stage of attaching an intermediate package embedded link trace of the process.

Referring now to FIG. 12, therein is shown a cross sectional view similar to FIG. 11 of an unfinished first type intermediate package of the first embodiment of the present invention after stage of attaching an intermediate package embedded link trace of the process.

An unfinished first type intermediate package 1200 is shown. The intermediate package embedded link trace 126 is attached to the contact metal trace 1004.

Figure 13:
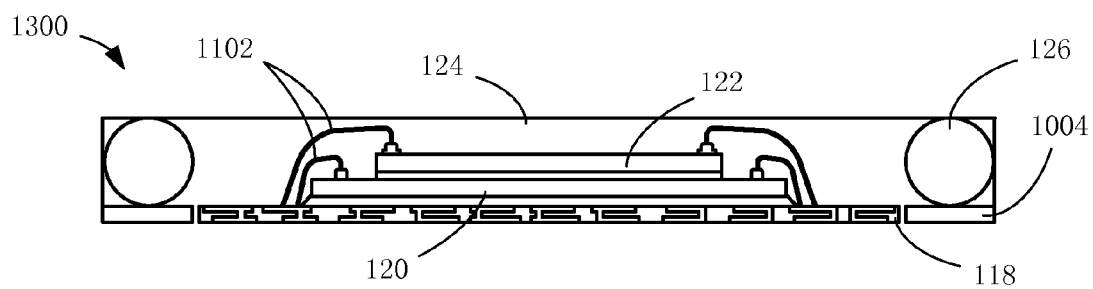
FIG. 13 is a cross-sectional view similar to FIG. 11 of an unfinished first type intermediate package of the first embodiment of the present invention after a stage of forming an intermediate package mold compound of the process.

Referring now to FIG. 13, therein is shown a cross sectional view similar to FIG. 11 of an unfinished first type intermediate package of the first embodiment of the present invention after a stage of forming an intermediate package mold compound of the process.

An unfinished first type intermediate package 1300 is shown. The intermediate package first die 120, the intermediate package second die 122, the intermediate package embedded link trace 126, and the intermediate bonding wire 1102 are encapsulated in the intermediate package mold compound 124.

The top surface of the intermediate package embedded link trace 126 is exposed and not encapsulated. The bottom surface of the intermediate package embedded link trace 126 is still in contact with the contact metal trace 1004.

Figure 14:
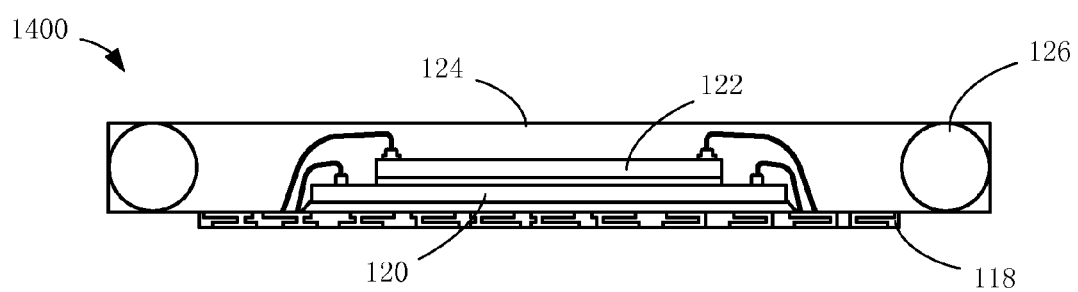
FIG. 14 is a cross-sectional view similar to FIG. 11 of a finished first type intermediate package of the first embodiment of the present invention after a stage of removing a contact metal trace of the process.

Referring now to FIG. 14, therein is shown a cross sectional view similar to FIG. 11 of a finished first type intermediate package of the first embodiment of the present invention after a stage of removing the contact metal trace of the process.

A finished first type intermediate package 1400 is shown. The contact metal trace 1004 in FIG. 1300 is removed. The bottom surface of the intermediate package embedded link trace 126 is exposed. The removal process could be a chemical etch process, a sputtering process, or other processes.

Figure 15:
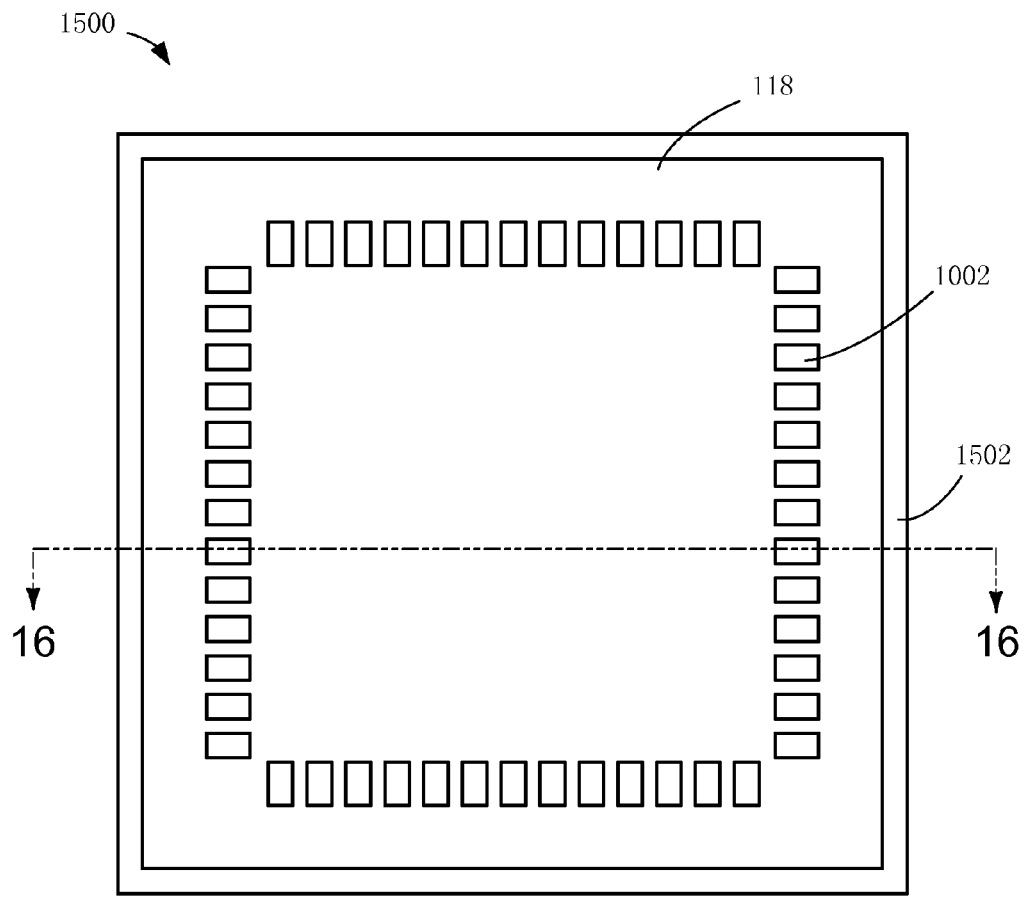
FIG. 15 is a top view similar to FIG. 10 of an unfinished first type intermediate package of the first embodiment of the present invention at an initial stage of an alternative process

Referring now to FIG. 15, therein is shown a top view similar to FIG. 10 of an unfinished first type intermediate package of the first embodiment of the present invention at an initial stage of an alternative process An unfinished first type intermediate package 1500 is shown. The intermediate bonding pad 1002 is shown on the intermediate interposer 118. The intermediate interposer 118 is attached to a contact tape 1502 along the edge. The contact tape 1502 could be made out of plastic material, organic material, or other materials.

Figure 16:
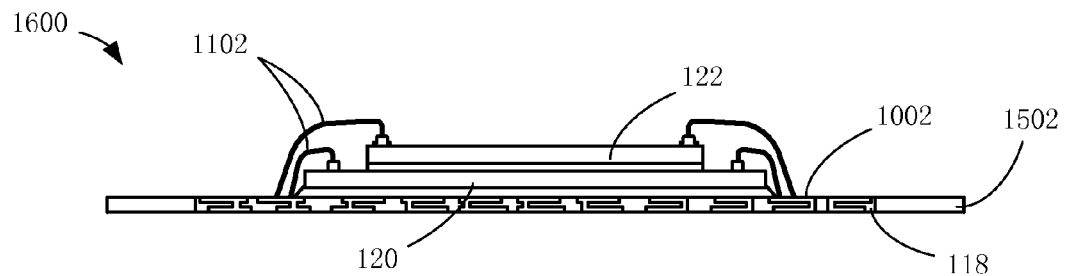
FIG. 16 is a cross-sectional view of an unfinished first type intermediate package of the first embodiment of the present invention along line 16-16 of FIG. 15 after a stage of die-attach and wire bonding of the alternative process.

Referring now to FIG. 16, therein is shown a cross-sectional view of an unfinished first type intermediate package of the first embodiment of the present invention along line 16-16 of FIG. 15 after a stage of die-attach and wire bonding of the alternative process.

An unfinished first type intermediate package 1600 is shown. The intermediate package first die 120 is attached to the intermediate interposer 118 and the intermediate package second die 122 is attached to the intermediate package first die 120. The intermediate package first die 120 and the intermediate package second die 122 are connected to the intermediate bonding pad 1002 through the intermediate bonding wire 1102.

Figure 17:
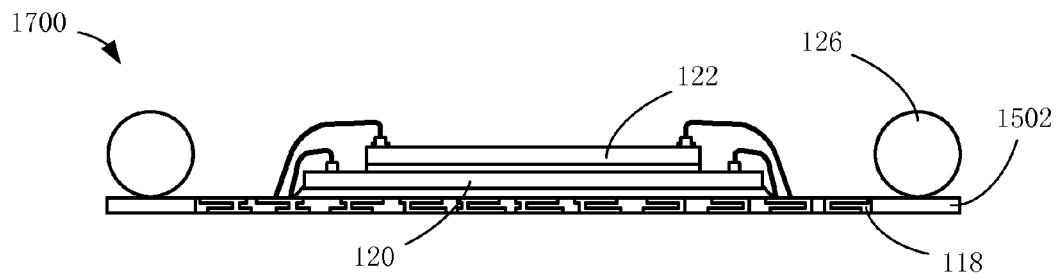
FIG. 17 is a cross-sectional view similar to FIG. 16 of an unfinished first type intermediate package of the first embodiment of the present invention after a stage of attaching an intermediate package embedded link trace of the alternative process.

Referring now to FIG. 17, therein is shown a cross sectional view similar to FIG. 16 of an unfinished first type intermediate package of the first embodiment of the present invention after a stage of attaching an intermediate package embedded link trace of the alternative process.

An unfinished first type intermediate package 1700 is shown. The intermediate package embedded link trace 126 is attached to the contact tape 1502.

Figure 18:
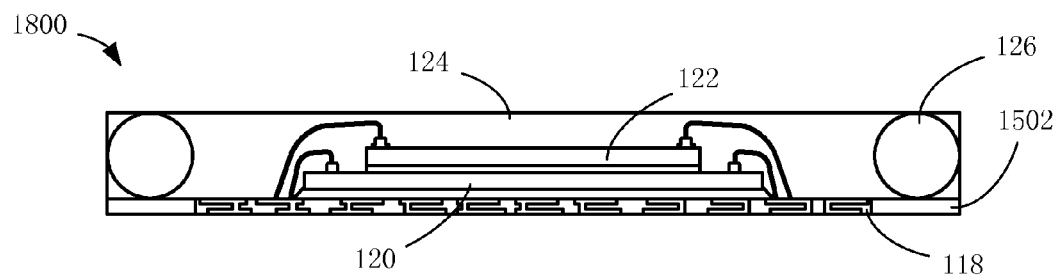
FIG. 18 is a cross-sectional view similar to FIG. 16 of an unfinished first type intermediate package of the first embodiment of the present invention after a stage of forming an intermediate package mold compound of the alternative process.

Referring now to FIG. 18, therein is shown a cross sectional view similar to FIG. 16 of an unfinished first type intermediate package of the first embodiment of the present invention after a stage of forming an intermediate package mold compound of the alternative process.

An unfinished first type intermediate package 1800 is shown. The intermediate package first die 120, the intermediate package second die 122, the intermediate package embedded link trace 126, and the intermediate bonding wire 1102 are encapsulated in the intermediate package mold compound 124.

The top surface of the intermediate package embedded link trace 126 is exposed and not encapsulated. The bottom surface of the intermediate package embedded link trace 126 is still in contact with the contact tape 1502.

Figure 19:
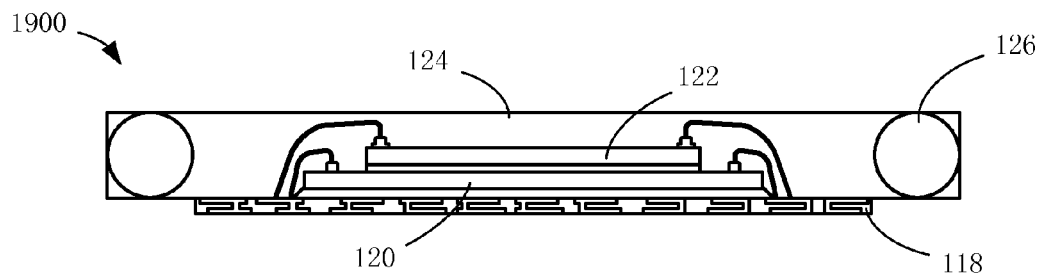
FIG. 19 is a cross-sectional view similar to FIG. 16 of a finished first type intermediate package of the first embodiment of the present invention after a stage of removing a contact tape of the alternative process.

Referring now to FIG. 19, therein is shown a cross sectional view similar to FIG. 16 of a finished first type intermediate package of the first embodiment of the present invention after a stage of removing the contact tape of the alternative process.

A finished first type intermediate package 1900 is shown. The contact tape 1502 in FIG. 1800 is removed. The bottom surface of the intermediate package embedded link trace 126 is exposed. The removal process could be a peeling process, a chemical etch process, or other processes.

Figure 20:
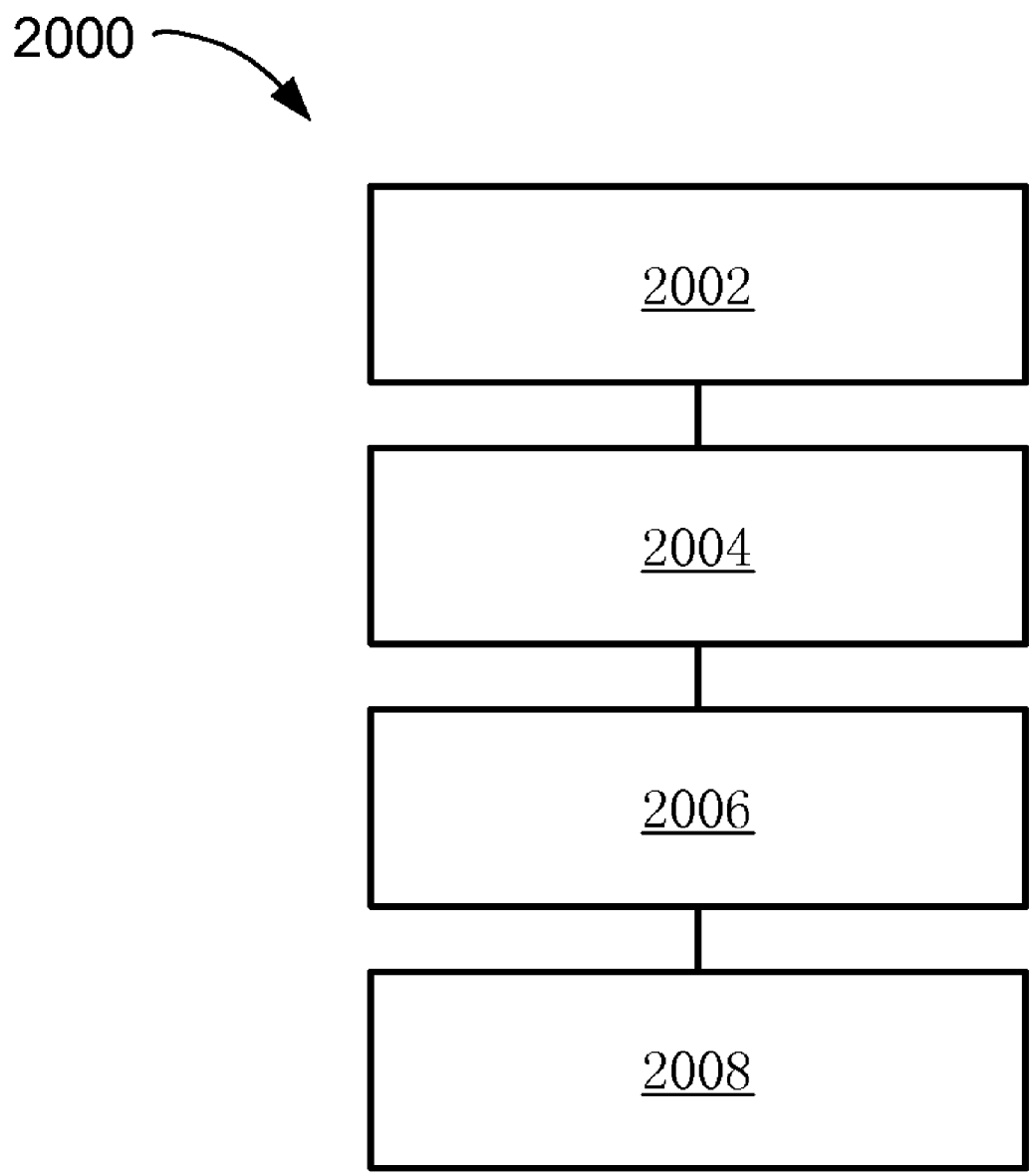
FIG. 20 is a flow chart of a method of manufacture of an integrated circuit packaging system in a further embodiment of the present invention.

Referring now to FIG. 20, therein is shown a flow chart of a method 2000 of manufacture of an integrated circuit packaging system in a further embodiment of the present invention. The method 2000 includes: forming a base package having a base interposer in a block 2002; forming an intermediate package having an intermediate interposer and an intermediate package embedded link trace, the intermediate package embedded link trace being encapsulated in an intermediate package mold compound in a block 2004; forming a cap package having a cap interposer in a block 2006; and connecting the intermediate package to the cap package and the base package using the intermediate package embedded link trace in a block 2008.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing semiconductor packaging systems fully compatible with conventional manufacturing processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a base package having a base interposer;
   forming an intermediate package having an intermediate interposer and an intermediate package embedded link trace, the intermediate package embedded link trace being encapsulated in an intermediate package mold compound and the intermediate package embedded link trace is not in touch with the intermediate interposer;
   forming a cap package having a cap interposer; and
   connecting the intermediate package to the cap package and the base package using the intermediate package embedded link trace.

2. The method as claimed in claim 1 wherein forming the base package includes forming a first type base package having an interconnecting contact extension and an edge interconnecting contact extension attached to a top surface of the base interposer and a base package contact extension attached to a bottom surface of the base interposer.

3. The method as claimed in claim 1 wherein forming the intermediate package includes forming a first type intermediate package having the intermediate package embedded link trace encapsulated in the intermediate package mold compound, the top and bottom surface of the intermediate package embedded link trace being exposed and not encapsulated.

4. The method as claimed in claim 1 wherein forming the base package includes forming a second type base package having a base package contact extension attached to a bottom surface of the base interposer.

5. The method as claimed in claim 1 wherein forming the intermediate package includes forming a second type intermediate package having an interconnecting contact extension attached to the bottom surface of the intermediate interposer and an edge interconnecting contact extension attached to the bottom surface of the intermediate package embedded link trace.

6. A method of manufacture of an integrated circuit packaging system comprising:

forming a base package having a base interposer and a semiconductor chip, the semiconductor chip being encapsulated in a base package mold compound;

forming an intermediate package having an intermediate interposer, a semiconductor chip; and an intermediate package embedded link trace, the semiconductor chip and the intermediate package embedded link trace being encapsulated in an intermediate package mold compound and the intermediate package embedded link trace is not in touch with the intermediate interposer;

forming a cap package having a cap interposer and a semiconductor chip, the semiconductor chip being encapsulated in a cap package mold compound; and connecting the intermediate package to the cap package and the base package using the intermediate package embedded link trace.

7. The method as claimed in claim 6 wherein connecting the intermediate package to the cap package includes:

attaching a cap package contact extension to the cap interposer; and connecting the cap package contact extension to the intermediate package embedded link trace.

8. The method as claimed in claim 6 further comprising:

connecting the intermediate interposer and the base interposer using an interconnecting contact extension.

9. The method as claimed in claim 6 wherein forming the intermediate package includes:

attaching the intermediate interposer to a contact metal trace through an edge bar;

attaching an intermediate package first die to the intermediate interposer;

attaching an intermediate package second die to the intermediate package first die;

connecting the intermediate package second die and the intermediate package first die to an intermediate bonding pad on the intermediate interposer through an intermediate bonding wire;

attaching the intermediate package embedded link trace to the contact metal trace;

encapsulating the intermediate package second die, the intermediate package first die, the intermediate bonding wire, and the intermediate package embedded link trace in the intermediate package mold compound; and removing the contact metal trace.

10. The method as claimed in claim 6 wherein forming the intermediate package includes:

attaching the intermediate interposer to a contact tape;

attaching an intermediate package first die to the intermediate interposer;

attaching an intermediate package second die to the intermediate package first die;

connecting the intermediate package second die and the intermediate package first die to an intermediate bonding pad on the intermediate interposer through an intermediate bonding wire;

attaching the intermediate package embedded link trace to the contact tape;

encapsulating the intermediate package second die, the intermediate package first die, the intermediate bonding wire, and the intermediate package embedded link trace in the intermediate package mold compound; and removing the contact tape.

11. An integrated circuit packaging system comprising:

a base package having a base interposer;

a cap package having a cap interposer; and an intermediate package having an intermediate interposer and an intermediate package embedded link trace, the intermediate package embedded link trace being encapsulated in an intermediate package mold compound and the intermediate package embedded link trace is not in touch with the intermediate interposer and, the intermediate package being connected to the cap package and the base package through the intermediate package embedded link trace.

12. The system as claimed in claim 11 wherein the base package is a first type base package having an interconnecting contact extension and an edge interconnecting contact extension attached to a top surface of the base interposer and a base package contact extension attached to a bottom surface of the base interposer.

13. The system as claimed in claim 11 wherein the intermediate package is a first type intermediate package having the intermediate package embedded link trace encapsulated in the intermediate package mold compound, the top and bottom surface of the intermediate package embedded link trace being exposed and not encapsulated.

14. The system as claimed in claim 11 wherein the base package is a second type base package having a base package contact extension attached to a bottom surface of the base interposer.

15. The system as claimed in claim 11 wherein the intermediate package is a second type intermediate package having an interconnecting contact extension attached to the bottom surface of the intermediate interposer and an edge interconnecting contact extension attached to the bottom surface of the intermediate package embedded link trace.

16. The system as claimed in claim 11 further comprising:
a semiconductor chip encapsulated in a cap package mold compound in the cap package;
a semiconductor chip encapsulated in an intermediate package mold compound in the intermediate package; and
a semiconductor chip encapsulated in a base package mold compound in the base package.

17. The system as claimed in claim 16 further comprising:
a cap package contact extension connecting the bottom surface of the cap interposer to the intermediate package embedded link trace.

18. The system as claimed in claim 16 wherein the intermediate package embedded link trace is an embedded solder ball.

19. The system as claimed in claim 16 wherein the interconnecting contact extension, the edge interconnecting contact extension, the cap package contact extension, and the base package contact extension, are solder balls.

20. The system as claimed in claim 16 wherein the cap interposer, the intermediate interposer, and the base interposer are laminated substrates.

* * * * *

UNITED STATES PATENT AND TRADEMARK OFFICE
CERTIFICATE OF CORRECTION

PATENT NO. : 7,863,100 B2  
APPLICATION NO. : 12/408662  
DATED : January 4, 2011  
INVENTOR(S) : Yang et al.

Page 1 of 1

It is certified that error appears in the above-identified patent and that said Letters Patent is hereby corrected as shown below:

Column 4:
    line 62, delete "die 1 10." and insert therefor --die 110.--

Column 5:
    line 5, delete "11 8." and insert therefor --118.--

Column 6:
    line 60, delete "1 16." and insert therefor --116.--

Column 8:
    line 3, delete "1 16." and insert therefor --116.--
    line 49, delete "FIG. 1," and insert therefor --FIG. 11,--

Signed and Sealed this
Twenty-second Day of March, 2011

David J. Kappos
*Director of the United States Patent and Trademark Office*